(12) United States Patent
Mau et al.

(10) Patent No.: US 6,880,139 B2
(45) Date of Patent: Apr. 12, 2005

(54) ELECTROMIGRATION RISK ANALYSIS IN INTEGRATED CIRCUIT POWER INTERCONNECT SYSTEMS USING PSEUDO DYNAMIC SIMULATION

(75) Inventors: Hendrik T. Mau, Santa Clara, CA (US); Anuj Trivedi, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 142 days.

(21) Appl. No.: 10/371,094

(22) Filed: Feb. 20, 2003

(65) Prior Publication Data

US 2004/0168136 A1 Aug. 26, 2004

(51) Int. Cl.[7] .............................................. G06F 17/50
(52) U.S. Cl. .................................. 716/4; 716/1; 716/5
(58) Field of Search .................................... 716/4, 5, 1

(56) References Cited

U.S. PATENT DOCUMENTS

| | | | |
|---|---|---|---|
| 5,379,231 A | 1/1995 | Pillage et al. ............... | 364/488 |
| 6,202,191 B1 * | 3/2001 | Filippi et al. .................. | 716/5 |
| 6,329,866 B1 * | 12/2001 | Watarai ....................... | 327/379 |

OTHER PUBLICATIONS

Liew et al., "Effects of High Current Pulses on Integrated Circuit Metallization Reliability", IEEE, InterSociety Conference on Thermal Phenomena in the Fabrication and Operation of Electronic Components: I–Therm '88, pp. 3–6.*

* cited by examiner

*Primary Examiner*—Vuthe Siek
*Assistant Examiner*—Sun James Lin
(74) *Attorney, Agent, or Firm*—Gunnison, McKay & Hodgson, L.L.P.

(57) ABSTRACT

Methods of and apparatuses for performing electromigration risk analyses of power interconnect systems in integrated circuits employ a pseudo dynamic simulation model, whereby all transistor gates of a transistor network coupled to the power interconnect system are switched at the same time. To accomplish simultaneity in switching, a netlist characterizing the transistor network is altered in a manner that all gates are connected to a common input signal node. Time dependent currents drawn by transistors of the transistor network connected to the power interconnect system are determined. The time dependent currents and dimensional characteristics gleaned from the layout of the integrated circuit are used to calculate peak, average, or RMS current densities. The current densities are compared to electromigration rules to determine what areas of the power interconnect system may be in violation of the electromigration rules.

30 Claims, 3 Drawing Sheets

ELECTROMIGRATION RISK ANALYSIS IN INTEGRATED CIRCUIT POWER INTERCONNECT SYSTEMS USING PSEUDO DYNAMIC SIMULATION

FIELD OF THE INVENTION

The present invention relates generally to reliability of integrated circuits. More particularly, the present invention relates to methods of and apparatuses for determining electromigration risks of power interconnect systems in integrated circuits.

BACKGROUND OF THE INVENTION

The reliability of power interconnect systems in integrated circuits is affected by a phenomenon known as "electromigration". Electromigration is the flow of metal ions under the influence of high electric current densities. The effects of electromigration in integrated circuits are manifested in the form of voids and hillocks along the power interconnect system in the integrated circuit. These voids and hillocks can result in increased resistance, which leads to large IR drops, can cause degradations in gate delays, and may even be sources of device failure.

Electromigration is becoming even more of a reliability concern as improvements in integrated circuit design are made. As integrated circuits become larger and faster, more current flows through integrated circuits' power interconnect systems. At the same time, lithography and device improvements result in the wire dimensions of the power interconnect system becoming narrower. The combined effect is an increase in current density, which as described above is the force behind electromigration.

To allay reliability concerns associated with electromigration, design of an integrated circuit should include provisions for maintaining current stresses below certain predefined limits. This is typically accomplished by predicting the current density distribution of the power interconnect structure using a modeling tool and comparing the predicted results to electromigration rules. Various electromigration analysis models have been developed to predict current densities of integrated circuit power interconnect systems. Because power interconnect systems are large and complex, however, it is not normally practicable to perform a full analysis at each and every section of the interconnect system. For this reason, existing models typically include approximations and simplifications that render the results inaccurate to some degree.

According to a first electromigration analysis model, known in the art as the "static model," all transistors of a transistor network coupled to the power interconnect system are assumed to switch simultaneously and all transistors are assumed to draw a certain percentage of their Idsat current when turned on. This percentage is based on the assumption that every transistor is driving a worst case fan out, and will therefore not take into account actual load conditions. In actual networks, however, all transistors do not switch simultaneously. For this reason, the static model overestimates the current flowing through the power interconnect system. Overestimating the current is unfavorable since it results in modifying the power interconnect system design in a way that requires wires of unnecessarily large widths.

Another electromigration analysis model is the "dynamic model". According to the dynamic model, vector files are employed to more accurately control the switching of the transistors of the transistor network coupled to the power interconnect system. The number of input vectors required is on the order of the number of input signals, which depends on the number of transistors making up the transistor network. Whereas the dynamic model is more accurate than the static model, it is unfavorable since the number of vector files that need to be generated may be prohibitive. Further, if the integrated circuit design is complex, the vector files may be difficult to define or even impossible to generate. Finally, the time to run the model may be so time consuming that the model is of not much practical use.

SUMMARY OF THE INVENTION

Methods of and apparatuses for performing electromigration risk analyses of power interconnect systems in integrated circuits are disclosed. The methods and apparatuses employ a pseudo dynamic simulation, whereby all transistor gates of a transistor network coupled to the power interconnect system are switched at the same time. To accomplish simultaneity in switching, a netlist characterizing the transistor network is altered in a manner that all gates are connected to a common input signal node. The common input signal node is driven by an input signal that drives all transistors at the same time to perform a transient simulation. Loading effects at internal nodes of the transistor network are accounted for by creating fake loads based on the dimensions of transistors coupled to the internal nodes. Loading effects experienced at output nodes of the transistor network are accounted for by creating fake loads based on expected, maximum or other load the output nodes are to experience from external devices, circuits or systems. All fake loads are coupled to pseudo power supplies. Time dependent currents drawn by transistors of the transistor network connected to the power interconnect system are determined and then used to calculate peak, average, RMS, and/or other current densities. The current densities are then compared to electromigration rules to determine what areas of the power interconnect system are in violation of the electromigration rules.

According to one aspect of the present invention, a method of predicting a current density distribution of a power interconnect system of an integrated circuit comprises steps of transforming a netlist of an integrated circuit design so that gates of transistors in the netlist are configured to receive a common signal, simulating the transformed netlist using the common signal to predict currents drawn from a power interconnect system of the integrated circuit, determining a predicted current density distribution of the power interconnect system, and comparing one or more predicted current densities of the predicted current density distribution to a maximum allowable current density.

According to another aspect of the invention, a method of predicting whether a power interconnect system of an integrated circuit complies with an electromigration rule comprises steps of modifying a netlist of an integrated circuit so that inputs of transistors in the netlist are configured to receive a common signal, determining currents drawn from a power interconnect system upon application of the common signal, calculating predicted current densities from the determined currents for at least one location of the power interconnect system, and comparing one or more of the predicted current densities to an electromigration rule.

According to other aspects of the invention, the methods of performing electromigration risk analyses may be embodied on a computer readable medium for execution by a processor of a computer.

Further aspects of the invention are described and claimed below, and a further understanding of the nature and advan-

DETAILED DESCRIPTION

Those of ordinary skill in the art will realize that the following detailed description of the present invention is illustrative only and is not intended to be in any way limiting. Other embodiments of the invention will readily suggest themselves to such skilled persons having the benefit of this disclosure.

Embodiments of the present invention are described herein in the context of methods of and apparatuses for performing electromigration risk analyses of power interconnect systems in integrated circuits. Whereas embodiments of the invention are described using an exemplary transistor network, those skilled in the art will readily understand that the apparatus and methodology described herein are also applicable and extend to transistor networks comprised of any number of inputs, outputs and internal nodes. Further, whereas the description often describes power interconnect systems comprised of a single power grid and a ground plane, those skilled in the art will readily understand that the inventions described are applicable and extend to integrated circuits having power interconnect systems having a plurality of independent power grids capable of providing different voltage levels to the transistor network.

The electromigration risk analysis methodology of the present invention may be embodied on any of a variety of known media for use with a data processing system, such as a diskette, hard drive, or CD-ROM. From this media, a microprocessor of a workstation, personal computer or other computer system may read and execute the code comprising the software embodying the electromigration risk analysis methodology. Further, the software embodying the electromigration risk analysis methodology may be distributed to users from the memory or storage of one computer system over a network. The methods and techniques for embodying software code in memory, on physical media, and/or distributing software code via networks are well known and will not be further discussed herein.

Reference will now be made in detail to implementations of the present invention as illustrated in the accompanying drawings. Unless, indicated otherwise, the same reference indicators will be used throughout the drawings and the following detailed description to refer to the same or like parts.

Figure 1:
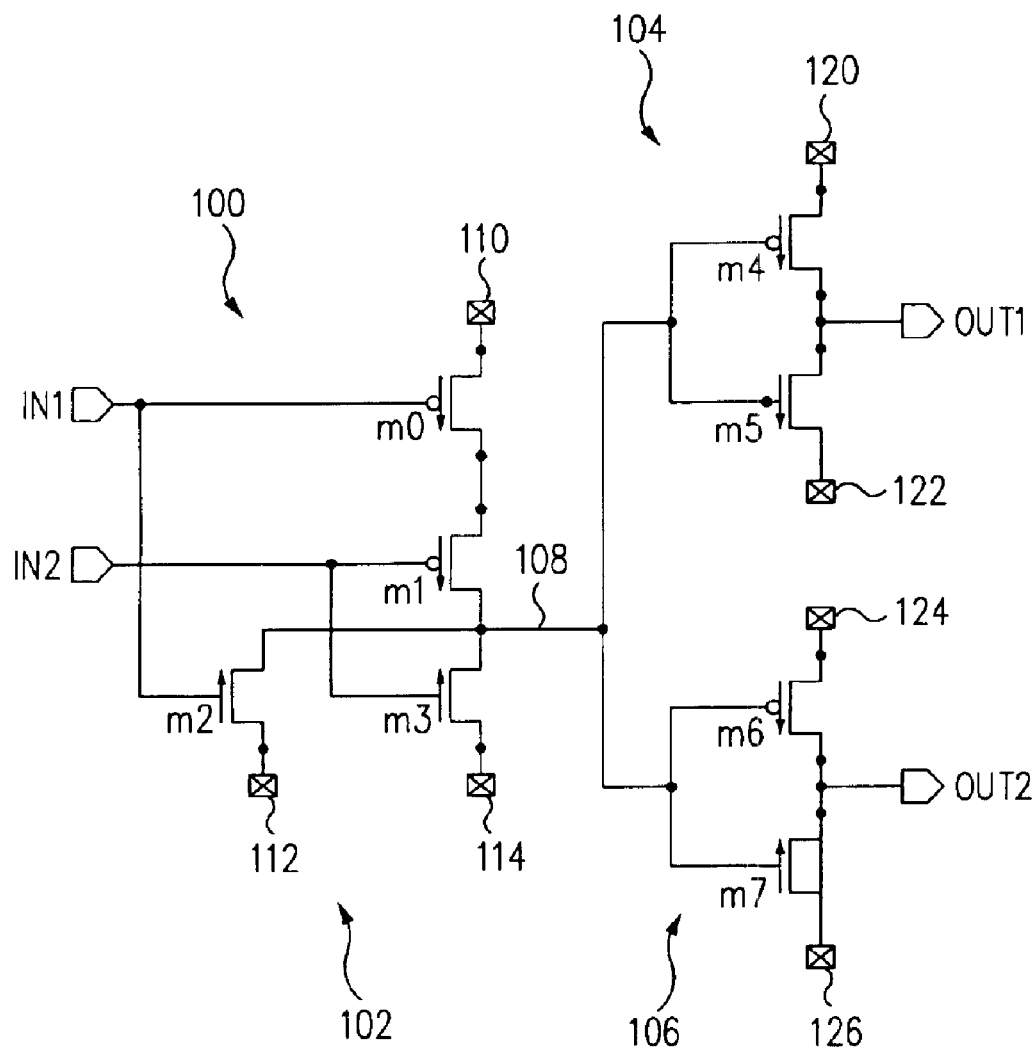
FIG. 1 shows an exemplary transistor network comprised of transistors that couple to a power interconnect system of an integrated circuit.

Referring to FIG. 1, there is shown an example of a transistor network 100 comprised of transistors that are coupled to a power interconnect system. Transistor network 100 is used to illustrate how the methods of the present invention may be used to determine current densities and electromigration rule violations. It should be emphasized that transistor network 100 is only exemplary and that other transistor networks with varying numbers and types of transistors, different numbers of inputs and outputs, etc. may be implemented in practice. Accordingly, those skilled in the art will understand that the transistor network 100 is used merely for illustrative and exemplary purposes and its specific attributes are not intended to limit the scope of the invention in any way.

As shown in FIG. 1, transistor network 100 may be conceptualized as comprising a plurality of subcircuits 102, 104, 106. Subcircuit 102 is configured to receive input signals at input nodes IN1 and IN2 and provide an intermediate output signal at internal node 108. Subcircuit 104 has two input nodes that are both coupled to internal node 108. Subcircuit 104 is configured to receive the intermediate output signal from node 108 and provide an output signal at output node OUT1. Subcircuit 106 is also configured to receive the intermediate output signal from node 108 and is operable to provide an output signal at output node OUT2. Input node IN1 is coupled to the gates of transistors m0 and m2. Input node IN2 is coupled to the gates of transistors m1 and m3. The drain of transistor m0 is coupled to the source of transistor m1. The drain of transistor m1 is coupled to the drain of transistor m3, and together this connection embodies internal node 108. The drain of transistor m2 is coupled to internal node 108

Internal node 108 is coupled to inputs of subcircuits 104 and 106. More specifically, internal node 108 is coupled to gates of transistors m4 and m5 of subcircuit 104 and is also coupled to gates of transistors m6 and m7 of subcircuit 106. The drain of transistor m4 is coupled to the drain of transistor m5, and together this connection embodies output node OUT1. The drain of transistor m6 is coupled to the drain of transistor m7, and together this connection embodies output node OUT2.

Transistor network 100 also includes connection points 110, 112, 114, 120, 122, 124 and 126, which all couple to a power interconnect system. More particularly, connection points 110, 120 and 124 couple to a first power interconnect structure, which may comprise, for example, a power grid having one or more metal layers and connection points 112, 114, 122 and 126 couple to a second power interconnect structure, which may comprise, for example, another power grid or a ground plane.

Figure 2:
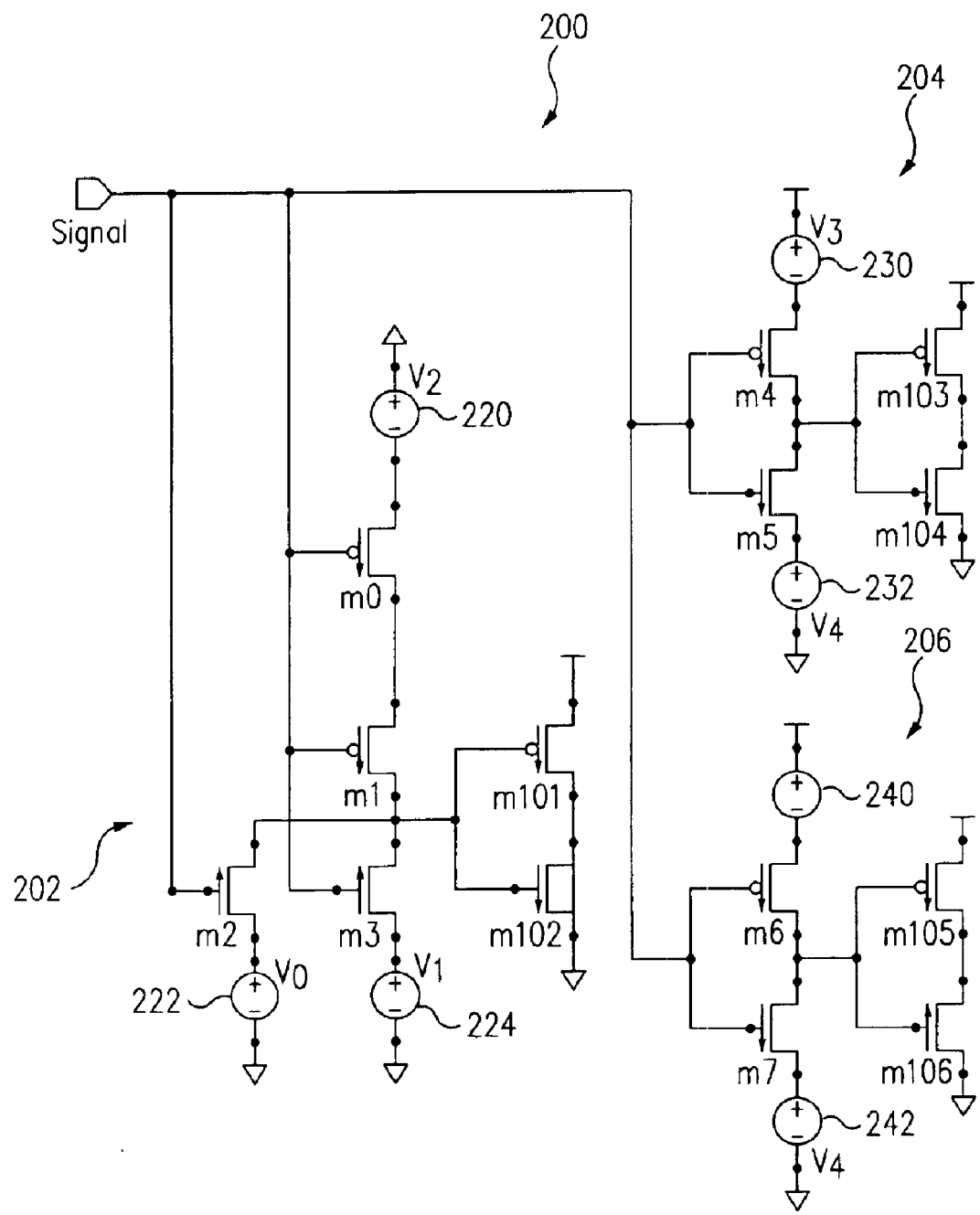
FIG. 2 shows a transformed transistor network derived from the exemplary transistor network shown in FIG. 1, the transformation employing methods of the present invention.

Referring now to FIG. 2 there is shown a transformed transistor network 200 that is derived from transistor network 100 using methods of the present invention. In transformed transistor network 200, subcircuits 102, 104 and 106 are conceptually separated and represented as subcircuits 202, 204 and 206, so that the subcircuits can be used to estimate individual current draw. Each subcircuit includes an output to mimic the load on the output of the subcircuit. Additionally, input nodes IN1 and IN2 are combined as a single node "SIGNAL", which is distributed to all subcircuits to simulate all inputs being simultaneously activated.

By combining all signal nodes into a single input node, the need for a specific input vector is avoided and all gates are switched substantially simultaneously. Additionally, the connection points are represented as individual voltage sources, which are coupled to either power or ground. Hence, each subcircuit is a separately controllable entity. More specifically, the load at internal load 108 is represented by transistors m101 and m102. The width of transistor m101 is the combination of the width of transistor m4 and m6 of transistor network 100. The width of transistor m102 is the combination of the width of transistor m5 and transistor m7. Transistors m101 m102 are configured as a CMOS inverter and together represent the load experienced by internal node 108. The load is a "fake" load in that it merely models the load at experienced by internal node 108 and is not coupled to the power interconnect structure being modeled. Those skilled in the art will appreciate that, whereas only a single internal node 108 and associated loading are shown in FIGS. 1 and 2, many other internal nodes would be present in the transistor network. For each of these nodes a "fake" load would be created in a manner similar to that described for internal node 108.

The loading experienced by output nodes OUT1 and OUT2 is characterized differently than loading experienced by internal nodes. Whereas CMOS inverter "fake" loads are used, the gate dimensions of the transistors making up the fake loads are determined by the expected, maximum, or other load that the respective output node is to experience from an external device, circuit or system. Accordingly, in FIG. 2, the loading at output node OUT1 is represented by transistor m103 and transistor m104, the width of transistors m103 and m104 being chosen to represent the expected, maximum or other external load experienced by transistor network 100 at output node OUT1. Similarly, loading at output node OUT2 is represented by transistor m105 and transistor m106, the width of transistors m105 and m106 being chosen to represent the expected, maximum, or other load experienced by transistor network 100 at output node OUT2.

Subcircuit 202 also includes representations of voltage sources 220, 222 and 224. These voltage sources represent the voltages that are supplied by the power interconnect system to transistor network 100 via connection points 110, 112 and 114, respectively. Subcircuit 204 includes representations of voltage sources 230 and 232. These voltage sources represent the voltages that are supplied by the power interconnect system to transistor network 100 via connection points 120 and 122, respectively. Subcircuit 206 includes representations of voltage sources 240 and 242. These voltage sources represent the voltages that are supplied by the power interconnect system to transistor network 100 via connection points 124 and 126.

Figure 3:
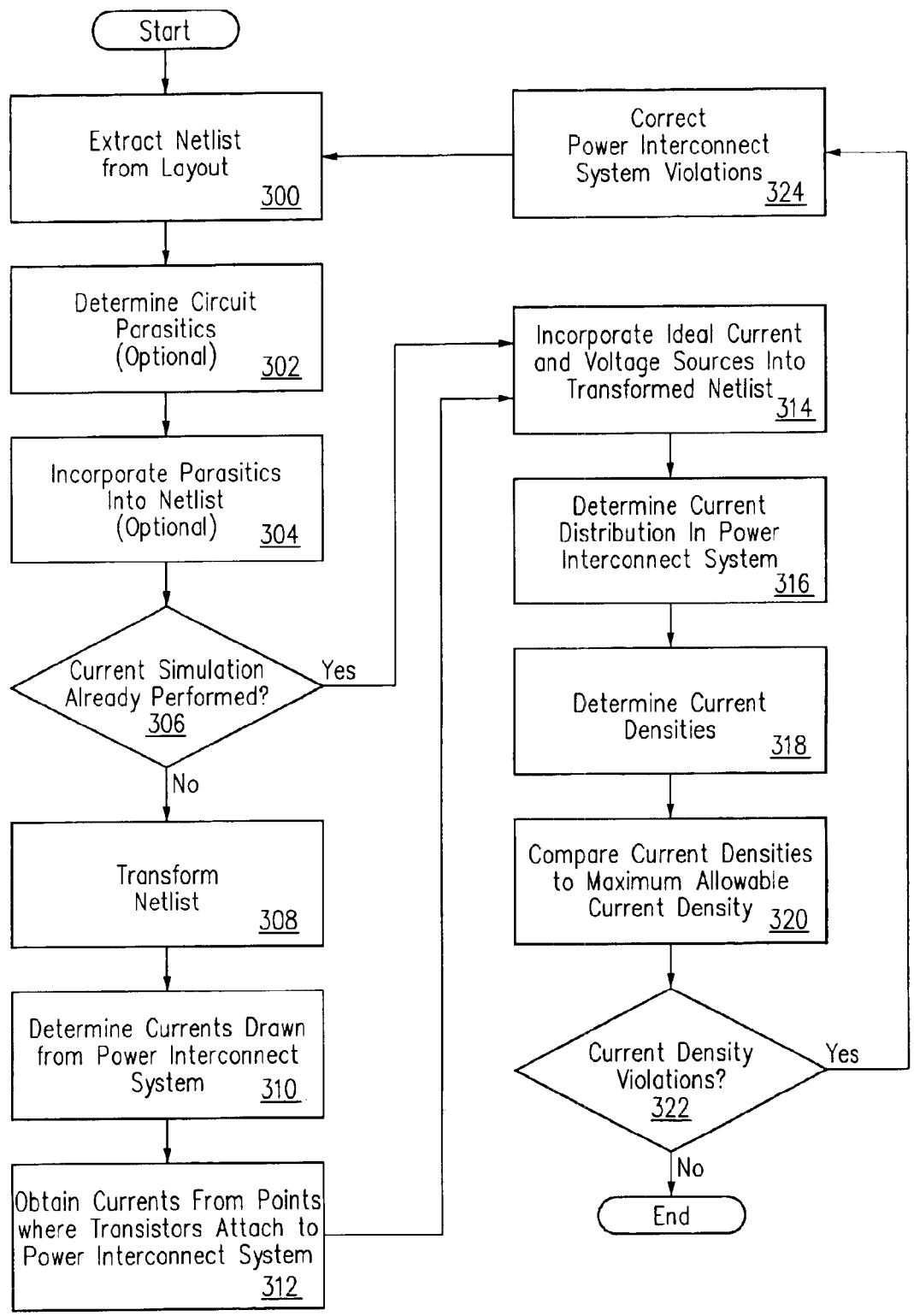
FIG. 3 is a flowchart that illustrates a process of determining current densities and electromigration rule violations of an integrated circuit power interconnect system, according to embodiments of the present invention.

Referring now to FIG. 3, there is shown a flowchart that illustrates a process 30 of determining current densities and electromigration rule violations of an integrated circuit power interconnect system, according to embodiments of the present invention. At a first step 300 in process 30 a netlist of the integrated circuit is extracted from the physical layout of the integrated circuit. The extracted netlist comprises representations of active devices (e.g. transistors) but does not include representations of parasitic elements (i.e. unwanted resistances and capacitances) incorporated in the integrated circuit.

Next, at optional step 302 parasitic information of the integrated circuit are retrieved or determined and extracted. There are various ways by which the parasitic information may be retrieved or determined and extracted. According to one embodiment of the invention, the parasitics are retrieved from a file that characterizes the parasitics in a detailed standard parasitic format (DSPF). Alternatively, the parasitics can be determined and extracted, e.g., by identifying locations where first, second, third, etc. metal layers intersect and using known thicknesses of inter-metal dielectric layers between the identified intersections and sheet resistance values to calculate the values of the parasitics. After the parasitic information is determined (assuming that optional step 302 is performed), at optional step 304 the wire interconnect load (e.g. as retrieved from the DSPF file) are back annotated (i.e. incorporated) in the pure netlist that was extracted at step 300.

Next in process 30, a decision 306 is encountered. Decision 306 queries as to whether a current simulation of the netlist has already been performed. If yes, process 30 jumps to step 314 and continues in the manner described in detail below. If no, process 30 continues to step 308, during which the netlist is transformed. Transforming the netlist comprises creating copies of all gate loads to make fake loads; connecting fake loads to associated drivers; and connecting gates of non-fake loads to a common signal source node, as described in detail above in relation to FIGS. 1 and 2. As alluded to above, each fake load is generated as follows: First, the gate widths of all PMOS devices of an identified load are summed and the gate widths of all NMOS devices associated with the identified load are summed. The gate widths of the various devices can be obtained, for example, from the circuit layout. Then, the fake load is made (e.g. in the form of an inverter as described above) having a fake PMOS transistor with a composite gate width determined by the sum of all PMOS gate widths and having a fake NMOS transistor with a composite gate width determined by the sum of all NMOS gate widths. Finally, the fake loads are connected to fake VDD and fake VSS, i.e. the fake loads are not connected to power interconnect system.

Fake loads for outputs of the integrated circuit that drive external components, circuits and/or systems are also generated, as described above in relation to FIGS. 1 and 2. Because output net contains transistors that do not have an attached load, designers can provide information as to what an expected, maximum (or other) load would be when the circuit is used in an application.

After the netlist is transformed, at step 310 the transformed simulation of the transformed netlist is performed over one or more system clock cycles to determine currents drawn from the power interconnect system of the integrated circuit. At step 312 currents are obtained from points where transistors of the integrated circuit attach to the power interconnect system. The currents obtained in steps 310 and 312 may comprise one or more of the average, RMS, peak (or other) currents supplied by the power interconnect system.

Next, at step 314 of process 30, ideal current and/or voltage sources, based on the currents measured in step 310 and 312, are incorporated in the transformed netlist. At step 316 the current distribution in the power interconnect system is determined and, with knowledge of the metal line widths at various positions in the power interconnect system, the current densities across the power interconnect system are calculated at step 318.

At step 320, the calculated current densities are compared to electromigration rules (e.g. as specified by the integrated circuit foundry), to determine areas and/or points in the power interconnect system that violate the electromigration rules are violated. (For a multiple metal layer power interconnect system, an electromigration rule may specify, for example, that no more than 5 amps per micron width in metal one is allowed.)

Next in process 30, a decision 322 is encountered. Decision 322 queries as to whether any electromigration rule violations were determined at step 320. If no, process 30 is complete. If yes, the electromigration rule violations in the power interconnect system are redesigned and steps 300–306 and steps 314–322 are repeated. Steps 308–312, already being performed, need not be performed again because step 324 only affects characteristics of the power grid and not the netlist or characteristics of the transistors comprising the netlist. In other words, even with a change in the power interconnect system, the currents through the transistors of the netlist remain the same. Only the wires making up the power grid and/or the distribution of the currents through power grid are altered.

Whereas the above is a complete description of the embodiments of the invention, various alternatives, modifications, and equivalents may be used. Therefore, the above description should not be taken as limiting the scope of the invention as it is defined by the appended claims.

What is claimed is:

1. A method of predicting a current density distribution of a power interconnect system of an integrated circuit design, the method comprising:
   transforming a netlist of the integrated circuit design so that gates of transistors in a transformed netlist are configured to receive a common signal;
   simulating the transformed netlist using the common signal to predict currents drawn from the power interconnect system of the integrated circuit;
   determining a predicted current density distribution of the power interconnect system; and
   comparing one or more predicted current densities of the predicted current density distribution to a maximum allowable current density.

2. The method of claim 1 wherein the maximum allowable current density is defined by an electromigration rule.

3. The method of claim 1 wherein the step of transforming further comprises identifying driver circuits and associated loads of the transformed netlist.

4. The method of claim 3, further comprising:
   generating fake loads for the identified associated loads; and
   coupling the fake loads to outputs of the identified driver circuits.

5. The method of claim 4 wherein gates of transistors of the identified associated loads are configured to receive the common signal.

6. The method of claim 4, further comprising coupling the fake loads to one or more fake power supplies and a fake ground.

7. The method of claim 4 wherein the fake loads are generated according to transistor widths of the identified associated loads.

8. The method of claim 3 wherein said identifying driver circuits includes identifying output driver circuits of the netlist.

9. The method of claim 8, further comprising:
   generating fake loads for the identified associated loads of the netlist;
   coupling the fake loads to outputs of the identified driver circuits;
   generating fake external loads for the output driver circuits; and
   coupling the fake external loads to outputs of the output drivers.

10. The method of claim 9 wherein gates of the transistors of the identified associated loads are configured to receive the common signal.

11. The method of claim 9, further comprising coupling the fake loads to one or more fake power supplies and a fake ground.

12. The method of claim 9 wherein the fake loads generated according to transistor widths of the identified associated loads.

13. The method of claim 9 wherein the external fake loads are generated according to transistor widths of anticipated external loads.

14. A method of predicting whether a power interconnect system of an integrated circuit complies with an electromigration rule, the method comprising:
   modifying a netlist of the integrated circuit so that inputs of transistors in the modified netlist are configured to receive a common signal;
   determining currents drawn from the power interconnect system upon application of the common signal;
   calculating predicted current densities from the determined currents for at least one location of the power interconnect system; and
   comparing one or more of the predicted current densities to an electromigration rule.

15. The method of claim 14, wherein said modifying further comprises identifying driver circuits and associated loads of the modified netlist.

16. The method of claim 15, further comprising the steps of:
   generating fake loads for the identified associated loads; and
   coupling the fake loads to outputs of the identified driver circuits.

17. The method of claim 16 wherein inputs of transistors of the identified associated loads are configured to receive the common signal.

18. The method of claim 16, further comprising coupling the fake loads to one or more fake power supplies and a fake ground.

19. The method of claim 16 wherein the identified associated loads are field effect transistors and the fake loads are generated according to transistor widths of the identified associated loads.

20. The method of claim 15 wherein said identifying driver circuits includes identifying output driver circuits of the modified netlist.

21. The method of claim 20, further comprising:
   generating fake loads for the identified associated loads of the netlist;
   coupling the fake loads to outputs of the identified driver circuits;
   generating fake external loads for the output driver circuits; and
   coupling the fake external loads to outputs of the output drivers.

22. The method of claim 21 wherein inputs of the transistors of the identified associated loads are configured to receive the common signal.

23. The method of claim 21, further comprising coupling the fake loads to one or more fake power supplies and a fake ground.

24. The method of claim 21 wherein the identified associated loads are field effect transistors and the fake loads are generated according to transistor widths of the identified loads.

25. The method of claim 21 wherein the external fake loads are generated according to transistor widths of anticipated external loads.

26. An apparatus for predicting a current density distribution of a power interconnect system of an integrated circuit design, said apparatus comprising:

means for transforming a netlist of the integrated circuit design so that gates of transistors in a transformed netlist are configured to receive a common signal;

means for simulating the transformed netlist using the common signal to predict currents drawn from the power interconnect system of the integrated circuit;

means for determining a predicted current density distribution of the power interconnect system; and means for comparing one or more predicted current densities of the predicted current density distribution to a maximum allowable current density.

27. An apparatus for predicting whether a power interconnect system of an integrated circuit complies with an electromigration rule, said apparatus comprising:

means for modifying a netlist of the integrated circuit so that inputs of transistors in the netlist are configured to receive a common signal;

means for determining currents drawn from the power interconnect system upon application of the common signal;

means for calculating predicted current densities from the determined currents for at least one location of the power interconnect system; and means for comparing one or more of the predicted current densities to an electromigration rule.

28. A computer readable medium having processor readable code for directing one or more processors to perform a method of predicting a current density distribution of a power interconnect system of an integrated circuit design, the method comprising:

transforming a netlist of the integrated circuit design so that gates of transistors in a transformed netlist are configured to receive a common signal;

simulating the transformed netlist using the common signal to predict currents drawn from the power interconnect system of the integrated circuit;

determining a predicted current density distribution of the power interconnect system; and comparing one or more predicted current densities of the predicted current density distribution to a maximum allowable current density.

29. The computer readable medium of claim 28 wherein the maximum allowable current density is defined by an electromigration rule.

30. A computer readable medium having processor readable code for directing one or more processors to perform a method of predicting whether a power interconnect system of an integrated circuit complies with an electromigration rule, the method comprising:

modifying a netlist of the integrated circuit so that inputs of transistors in the modified netlist are configured to receive a common signal;

determining currents drawn from the power interconnect system upon application of the common signal;

calculating predicted current densities from the determined currents for at least one location of the power interconnect system; and comparing one or more of the predicted current densities to an electromigration rule.

* * * * *